United States Patent
Kang et al.

(10) Patent No.: US 9,780,578 B2
(45) Date of Patent: Oct. 3, 2017

(54) BATTERY MANAGEMENT SYSTEM FOR TRANSMITTING SECONDARY PROTECTION SIGNAL AND DIAGNOSIS SIGNAL USING A SMALL NUMBER OF INSULATION ELEMENTS

(71) Applicant: LG CHEM, LTD., Seoul (KR)

(72) Inventors: Ju-Hyun Kang, Daejeon (KR); Yasuhito Eguchi, Daejeon (KR); Shoji Tanina, Daejeon (KR)

(73) Assignee: LG CHEM, LTD., Seoul (KR)

(*) Notice: Subject to any disclaimer, the term of this patent is extended or adjusted under 35 U.S.C. 154(b) by 186 days.

(21) Appl. No.: 14/442,216

(22) PCT Filed: Oct. 15, 2014

(86) PCT No.: PCT/KR2014/009686
§ 371 (c)(1),
(2) Date: May 12, 2015

(87) PCT Pub. No.: WO2015/060576
PCT Pub. Date: Apr. 30, 2015

(65) Prior Publication Data
US 2016/0261125 A1 Sep. 8, 2016

(30) Foreign Application Priority Data
Oct. 25, 2013 (KR) .................. 10-2013-0127905

(51) Int. Cl.
*H02J 7/14* (2006.01)
*H02J 7/00* (2006.01)
(Continued)

(52) U.S. Cl.
CPC ............. *H02J 7/0014* (2013.01); *B60L 11/18* (2013.01); *B60L 11/1853* (2013.01);
(Continued)

(58) Field of Classification Search
CPC ....................................................... H02J 7/14
(Continued)

(56) References Cited

U.S. PATENT DOCUMENTS

| 5,982,145 A | 11/1999 | Eguchi |
| 7,800,342 B2 * | 9/2010 | Kobayashi ............ H02J 7/0019 320/116 |

(Continued)

FOREIGN PATENT DOCUMENTS

| CN | 101312293 A | 11/2008 |
| CN | 101976864 A | 2/2011 |

(Continued)

OTHER PUBLICATIONS

International Search Report issued in PCT/KR2014/009686, dated Feb. 6, 2015.

*Primary Examiner* — Thuan Do
(74) *Attorney, Agent, or Firm* — Birch, Stewart, Kolasch & Birch, LLP

(57) ABSTRACT

Disclosed is a battery management system for transmitting a secondary protection signal and a diagnosis signal using a small number of insulation elements. N battery management units included in the battery management system transmit at least two pieces of data via one communication line through time division. N data signals transmitted from the N battery management units are transmitted in a sequential order or are mixed to one signal and transmitted to an external device.

23 Claims, 8 Drawing Sheets

(51) Int. Cl.

| | | |
|---|---|---|
| *H04J 3/02* | (2006.01) | |
| *G01R 31/36* | (2006.01) | |
| *B60L 11/18* | (2006.01) | |
| *H04Q 9/00* | (2006.01) | |
| *H01M 10/42* | (2006.01) | |
| *H01M 10/48* | (2006.01) | |

(52) U.S. Cl.
CPC .......... *B60L 11/1861* (2013.01); *G01R 31/36* (2013.01); *G01R 31/3655* (2013.01); *G01R 31/3658* (2013.01); *G01R 31/3689* (2013.01); *H01M 10/425* (2013.01); *H01M 10/482* (2013.01); *H02J 7/007* (2013.01); *H02J 7/0018* (2013.01); *H02J 7/0021* (2013.01); *H02J 7/0068* (2013.01); *H04J 3/02* (2013.01); *H04Q 9/00* (2013.01); *H01M 2010/4271* (2013.01); *H04Q 2209/10* (2013.01); *H04Q 2209/30* (2013.01); *Y02T 10/7055* (2013.01)

(58) Field of Classification Search
USPC ....................................................... 320/118
See application file for complete search history.

(56) References Cited

U.S. PATENT DOCUMENTS

| | | | |
|---|---|---|---|
| 2005/0269990 A1 | 12/2005 | Yudahira | |
| 2007/0216369 A1 | 9/2007 | Chandler | |
| 2007/0236173 A1 | 10/2007 | Kimura | |
| 2009/0027009 A1 | 1/2009 | Sivertsen | |
| 2010/0052615 A1 | 3/2010 | Loncarevic | |
| 2010/0116570 A1* | 5/2010 | Sugawara | B60K 1/04 180/65.1 |
| 2010/0286938 A1 | 11/2010 | Kaneko | |
| 2011/0053255 A1 | 3/2011 | Smylie et al. | |
| 2011/0161024 A1 | 6/2011 | Sim et al. | |
| 2012/0280694 A1 | 11/2012 | Song et al. | |
| 2013/0207613 A1 | 8/2013 | Loncarevic | |

FOREIGN PATENT DOCUMENTS

| | | |
|---|---|---|
| CN | 102171907 A | 8/2011 |
| EP | 2475064 A2 | 7/2012 |
| JP | 10-341635 A | 12/1998 |
| JP | 2003-70171 A | 3/2003 |
| JP | 2005-333717 A | 12/2005 |
| JP | 2008-189065 A | 8/2008 |
| JP | 2009-168720 A | 7/2009 |
| JP | 2009-232671 A | 10/2009 |
| JP | 2012-47520 A | 3/2012 |
| JP | 2013-88233 A | 5/2013 |
| KR | 10-2007-0100149 A | 10/2007 |
| KR | 10-2011-0074207 A | 6/2011 |

\* cited by examiner

BATTERY MANAGEMENT SYSTEM FOR TRANSMITTING SECONDARY PROTECTION SIGNAL AND DIAGNOSIS SIGNAL USING A SMALL NUMBER OF INSULATION ELEMENTS

TECHNICAL FIELD

The present disclosure relates to a battery management system (BMS) for transmitting a secondary protection signal and a diagnosis signal, and more particularly, to a BMS for transmitting a secondary protection signal and a diagnosis signal using a small number of insulation elements.

The present application claims priority to Korean Patent Application No. 10-2013-0127905 filed in the Republic of Korea on Oct. 25, 2013, the disclosures of which are incorporated herein by reference.

BACKGROUND ART

Due to its characteristics of being easily applicable to various products and electrical characteristics such as a high energy density, a secondary battery is not only commonly applied to a portable device, but universally applied to an electric vehicle (EV), a hybrid electric vehicle (HEV), or an energy storage system that is propelled by an electric motor. This secondary battery is gaining attention for its primary advantage of remarkably reducing the use of fossil fuels and not generating by-products from the use of energy, making it a new eco-friendly and energy efficient source of energy.

A secondary battery can be charged and discharged repeatedly by electrochemical reactions between elements including a cathode current collector, an anode current collector, a separator, an active material, an electrolyte solution, and the like. By way of example, a lithium polymer secondary battery being widely used has an operating voltage in a range of about 3.7V to about 4.2V. Accordingly, to obtain a high power battery pack for use in an electric vehicle, a plurality of unit secondary battery cells are connected in series to construct a battery pack.

In addition to this basic structure, the battery pack further includes a battery management system (BMS) to monitor and control a state of a secondary battery by applying an algorithm for control of power supply to a driving load such as a motor, measurement of electrical characteristic values such as current or voltage, charge/discharge control, voltage equalization control, state of charge (SOC) estimation, and the like.

Recently, with the increasing need for a high-capacity structure as well as utilization as an energy storage source, the demand for a battery pack of a multi-module structure in which a plurality of battery modules including a plurality of secondary battery cells are assembled, is also increasing.

Because the battery pack of the multi-module structure includes a plurality of secondary battery cells, there is a limitation in controlling the charge/discharge state of all the secondary battery cells or the plurality of battery modules using a single BMS. Accordingly, a recent technology has been introduced in which a battery management unit (BMU) is provided to each battery module included in the battery pack, the BMUs are designated as a slave unit, and a master BMS is additionally provided to control the slave units, such that the charge and discharge of each battery module is controlled in a master-slave mode.

FIG. 1 is a block diagram schematically illustrating a connected state of an external device 10 and a BMS 100 according to a related art.

Referring to FIG. 1, the BMS 100 including eight slave units 210 and one master unit 211 is provided. Also, the BMS 100 is connected to a battery pack 110 including a plurality of secondary battery cells 111 connected in series. The BMS 100 controls the charge and discharge of the battery pack 110, and further, measures the voltage of the secondary battery cells 111 included in the battery pack 110. The BMS 100 receives a control signal associated with charge and discharge from the external device 10, and transmits data associated with a state of the secondary battery cells 111. However, as described in the foregoing, because the battery pack 110 includes the plurality of unit secondary battery cells connected in series to obtain a high power battery pack for use in electric vehicles and the like, the external device 10 needs to be electrically separated from the BMS 100 to prevent the external device 10 from being damaged due to a high voltage.

To this end, a photo coupler capable of transmitting and receiving an electrical signal while electrically separating the external device 10 from the BMS 100 is connected and used.

The photo coupler is also called an opto-coupler. The photo coupler corresponds to a switching element including a light emitting source (input) and a light detector (output). Generally, an infrared light emitting diode (LED) is used as the light emitting source, and a photodiode or a phototransistor which turns on in response to light is used as the light detector. Thus, when an electric current flows to the input side, the light emitting source emits light, and then the output side element, i.e., the photodiode or phototransistor turns on. That is, the photo coupler is a switching element designed to turn on and off by light, not electrical coupling.

When the photo coupler is used in connecting the external device 10 to the BMS 100, an advantage is that the external device 10 may be electrically separated from the BMS 100. Also, a reverse current causing a high voltage current from the battery pack 110 to be inputted to the external device 10 side may be prevented while transmitting a data signal, and influence of electromagnetic waves generating during charge and discharge of the battery pack 110 may be lessened.

When the BMS operates in a master-slave mode, to provide a precaution against a failure that may occur in the master unit 211, the slave units 210 may be configured to directly deliver information associated with the secondary battery cells 111 to the external device 10. FIG. 1 illustrates three types of data each slave unit 210 transmits to the external device 10 to take precaution against a failure in the master unit 211.

A '2nd_PROT' signal transmitted from the slave unit 210 refers to a signal representing that the secondary battery cells 111 are over-charged more than a preset voltage. A 'Under V PROT' signal transmitted from the slave unit 210 refers to a signal representing that the secondary battery cells 111 are over-discharged less than a preset voltage. A 'Diag' signal transmitted from the slave unit 210 refers to a signal representing whether an abnormality has occurred or not through self-diagnosis of the slave unit 210.

In this way, each slave unit 210 transmits three types of data to the external device 10, and when a number of such slave units 210 is eight, a total number of photo couplers needed to connect the external device 10 to the slave units 210 is twenty four. The photo coupler is a more costly element than other electric and electronic elements, which is a factor of increasing a manufacturing cost of the BMS.

Therefore, there is a need for studies on a BMS that may transmit a signal from the slave units 210 included in the BMS 10 to the external device 10 while maintaining insulation between the BMS 100 and the external device 10.

DISCLOSURE

Technical Problem

The present disclosure is designed to solve the problem of the related art, and therefore the present disclosure is directed to providing a battery management system (BMS) for transmitting a secondary protection signal and a diagnosis signal using a small number of insulation elements.

Technical Solution

To achieve the object, a battery management system according to the present disclosure is a system that manages a battery pack, and includes N battery management units configured to manage secondary batteries included in the battery pack, in which N is a natural number greater than or equal to 2, N communication lines electrically connected to each battery management unit to transmit data to an external device which controls the battery management system, and N insulation elements connected between the external control device and the battery management system and configured to transmit a signal while electrically separating the external device from the N communication lines, wherein each battery management unit transmits at least two pieces of data through time division.

To achieve the object, a battery management system according to the present disclosure is a system that manages a battery pack, and includes N battery management units configured to manage secondary batteries included in the battery pack, in which N is a natural number greater than or equal to 2, N communication lines electrically connected to each battery management unit to transmit data to an external device which controls the battery management system, an insulation element configured to transmit a signal while electrically separating the external control device from the battery management system, a switch configured to selectively connect any one of the N communication lines to the insulation element by a control signal, and a switch controller configured to output a control signal to the switch, wherein each battery management unit transmits at least two pieces of data through time division.

To achieve the object, a battery management system according to the present disclosure is a system that manages a battery pack, and includes N battery management units configured to manage secondary batteries included in the battery pack, in which N is a natural number greater than or equal to 2, N communication lines electrically connected to each battery management unit to transmit data to an external device which controls the battery management system, an insulation element configured to transmit a signal while electrically separating the external control device from the battery management system, and a calculator electrically connected to the N communication lines to connect any one of the N communication lines to the insulation element, wherein each battery management unit transmits at least two pieces of data through time division.

To achieve the object, a battery management system according to the present disclosure is a system that manages a battery pack, and includes N battery management units configured to manage secondary batteries included in the battery pack, in which N is a natural number greater than or equal to 2, N communication lines electrically connected to each battery management unit to transmit data to an external device which controls the battery management system, an insulation element configured to transmit a signal while electrically separating the external control device from the battery management system, and a signal mixer electrically connected to the N communication lines to mix signals received through the N communication lines, wherein each battery management unit transmits at least two pieces of data through time division.

To achieve the object, a battery management system according to the present disclosure is a system that manages a battery pack, and includes N battery management units configured to manage secondary batteries included in the battery pack, in which N is a natural number greater than or equal to 2, a communication line electrically connected to the N battery management units to transmit data to an external device which controls the battery management system, an insulation element configured to transmit a signal while electrically separating the external control device from the battery management system, and a signal mixer electrically connected to the communication line to mix signals received from each battery management unit through the communication line, wherein each battery management unit transmits at least two pieces of data through time division.

The insulation element according to the present disclosure may be a photo coupler.

The battery management system according to the present disclosure may further include a level shift electrically connected between each battery management unit and the communication line.

According to the battery management system of the present disclosure, in the battery management system with the switch controller, the switch controller may be connected to the external device through the insulation element, and may be controlled by the external device.

According to the battery management system of the present disclosure, in the battery management system with the calculator, the calculator may be connected to the external device through the insulation element, and may receive a control signal from the external device.

According to an exemplary embodiment of the present disclosure, each battery management unit may transmit at least two pieces of data through time division using ADSYNC changing in logic level of a signal at a data transmission preparation section and a start point of a data transmission section.

In this instance, the at least two pieces of data included in the data transmission section of the ADSYNC may have the same width of each data, and a width of data distant from the start point of the data transmission section may be wider than a width of data close to the start point. In the latter case, the width of the data distant from the start point of the data transmission section may be wider by at least 5% than the width of the data close to the start point of the data transmission section.

Also, a pulse indicating a boundary between the data may be included in the data transmission section of the ADSYNC.

According to an exemplary embodiment of the present disclosure, the N battery management units may further include a synchronization line to establish an electrical connection for synchronization with adjacent other battery management unit. In this instance, the N battery management units may perform synchronization by ADSYNC.

The N battery management units may respectively output a free-run ADSYNC and may be synchronized to any one of the outputted free-run ADSYNCs, and the N battery management units may be synchronized to a free-run ADSYNC with a narrowest width of a data transmission preparation section and a narrowest width of an ADSYNC cycle among the free-run ADSYNCs outputted from the N battery management units.

Advantageous Effects

According to the present disclosure, a battery management system may be connected to an external device using a small number of insulation elements.

BRIEF DESCRIPTION OF THE DRAWINGS

The accompanying drawing illustrates a preferred embodiment of the present disclosure and together with the foregoing disclosure, serves to provide further understanding of the technical spirit of the present disclosure, and thus, the present disclosure is not construed as being limited to the drawing.

MODE FOR CARRYING OUT THE INVENTION

Figure 1:
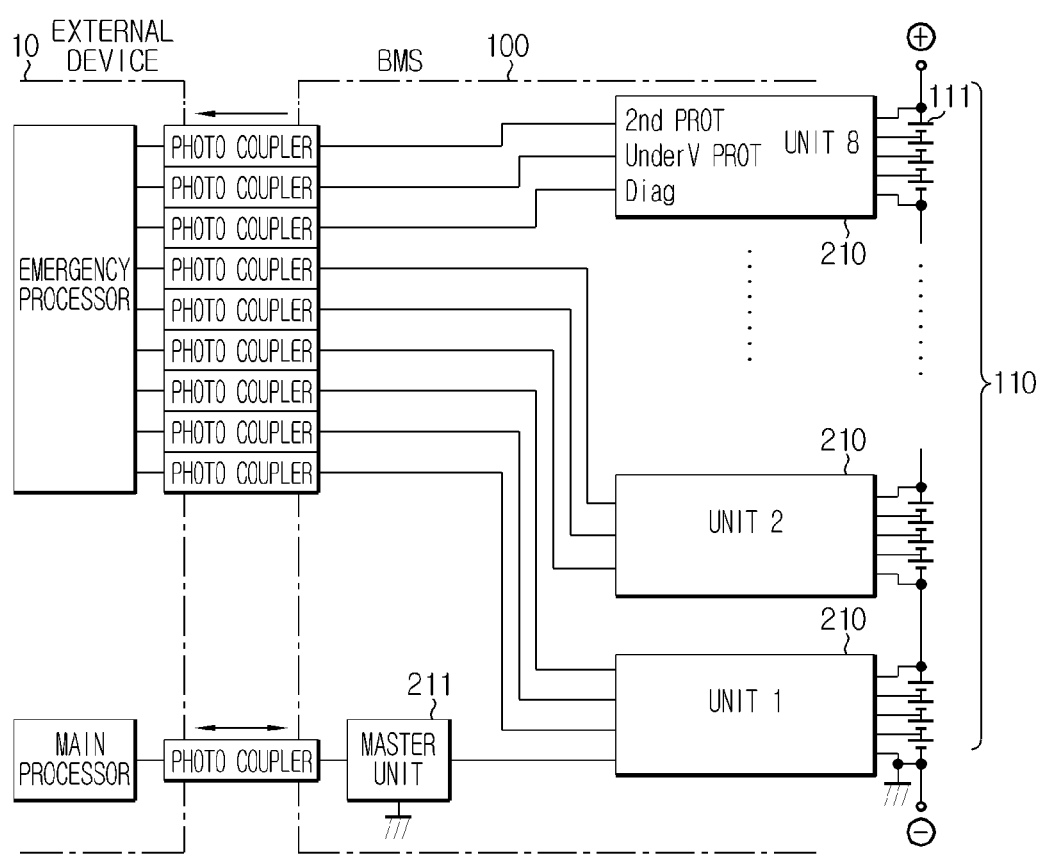
FIG. 1 is a block diagram schematically illustrating a connected state of an external device and a battery management system (BMS) according to a related art.

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation. Therefore, the description proposed herein is just a preferable example for the purpose of illustrations only, not intended to limit the scope of the disclosure, so it should be understood that other equivalents and modifications could be made thereto without departing from the spirit and scope of the disclosure.

FIGS. 2 through 6 are block diagrams schematically illustrating architectures of battery management systems (BMSs) 101~106 according to the present disclosure.

Hereinafter, in the description of the BMSs 101~106 according to the present disclosure with reference to FIGS. 2 through 6, it should be understood that elements with the same reference numerals represent elements performing the same function. Thus, a detailed description of each element will be provided later, and the following description is made based on a difference between each embodiment.

Figure 2:
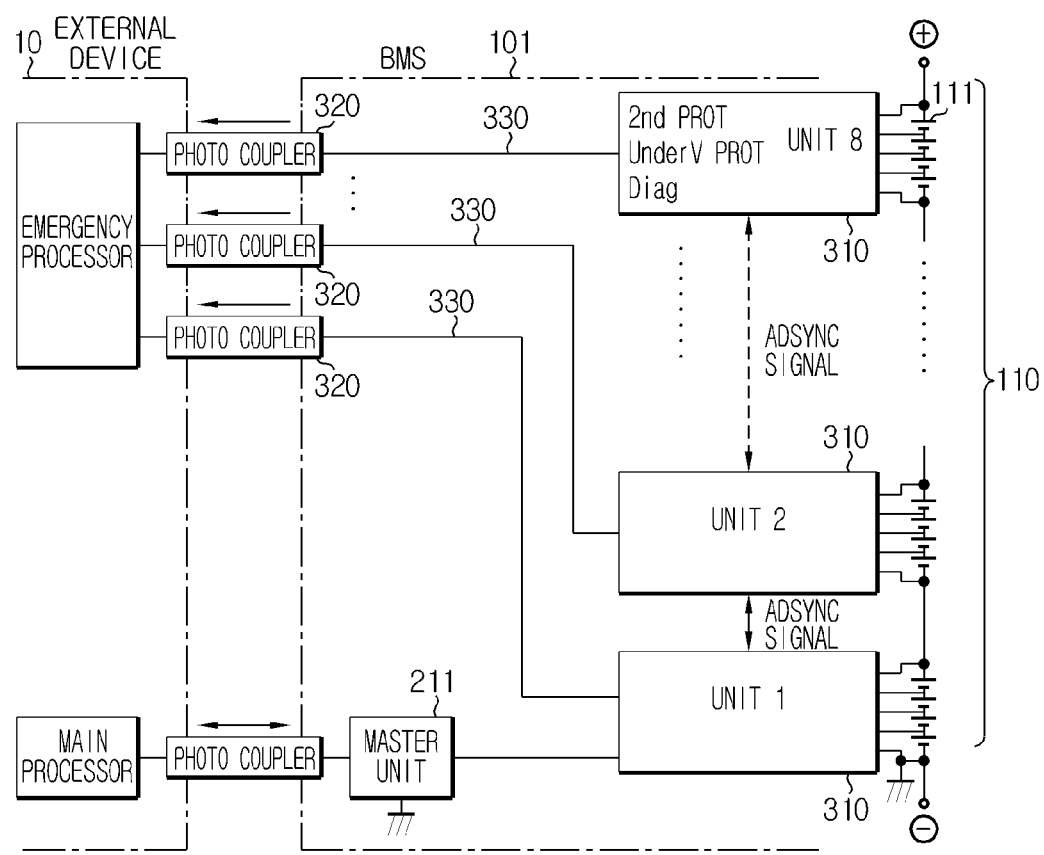
FIGS. 2 through 6 are block diagrams schematically illustrating an architecture of a BMS according to the present disclosure.

First, a first embodiment according to the present disclosure as shown in FIG. 2 is described. For convenience of understanding, a BMS 101 according to the first embodiment of the present disclosure is described together with the BMS 100 according to the related art as shown in FIG. 1. Each battery management unit (BMU) 310 shown in FIG. 2 is connected with each communication line 330. That is, dissimilar to the related art, a number of communication lines do not increase with an increasing number of data to be transmitted. The first embodiment is characterized in that each BMU 310 transmits data to the external device 10 via each communication line 330. Thus, each BMU 310 transmits at least two pieces of data through time division.

Also, each BMU 310 is connected to the external device 10 one-to-one through an insulator element. In the present disclosure, the insulator element may be a photo coupler 320. Since a description of the photo coupler 320 is provided in the foregoing, an overlapping description is omitted herein.

Figure 3:
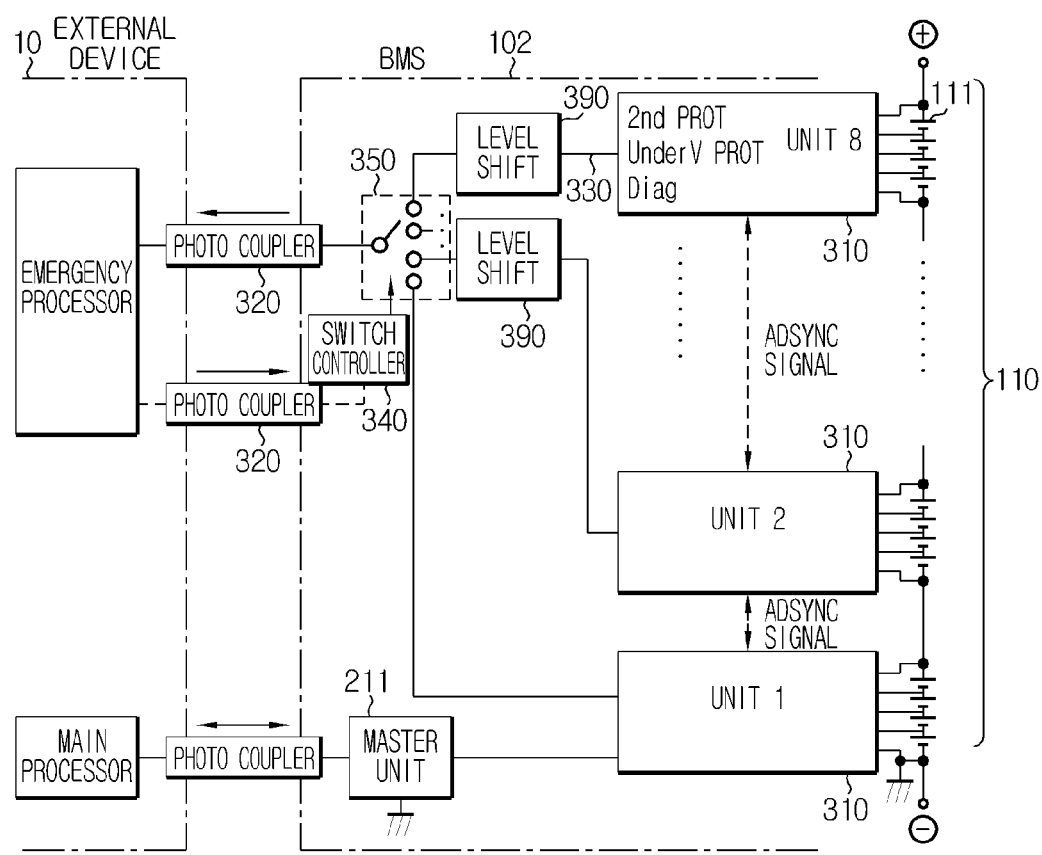

Next, a second embodiment according to the present disclosure as shown in FIG. 3 is described. For convenience of understanding, a BMS 102 according to the second embodiment of the present disclosure is described with the BMS 101 according to the first embodiment as shown in FIG. 2.

When comparing the BMS 102 according to the second embodiment of the present disclosure to the BMS 101 according to the first embodiment, it can be seen that one photo coupler (320 depicted at top) is used in connecting to the BMUs 310 to the external device 10. Also, it can be seen that a switch 350 and a switch controller 340 are included to selectively connect the BMUs 310 to the external device 10. Also, it can be seen that a photo coupler (320 depicted at bottom) is added to control the switch controller 340. Thus, a total number of photo couplers 320 is two.

The switch 350 serves to selectively connect any one of the communication lines 330 to the photo coupler 320 by a control signal of the switch controller 340. In this instance, the switch controller 340 is connected to the external device 10 through the photo coupler 320, and may be controlled by the external device 10. The BMU 310 having the communication line 330 connected to the photo coupler 320 through the switch 350 may transmit data to the external device 10.

Figure 4:
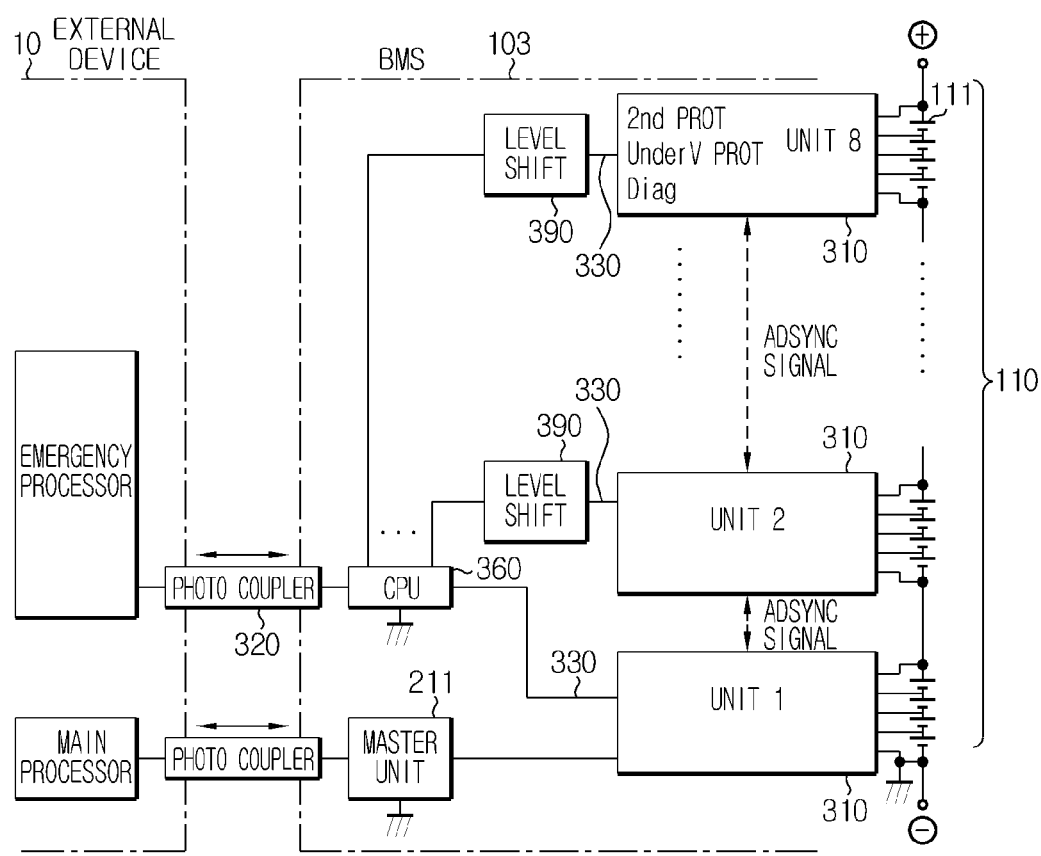

Next, a third embodiment according to the present disclosure as shown in FIG. 4 is described. For convenience of understanding, a BMS 103 according to the third embodiment of the present disclosure is described with the BMS 102 according to the second embodiment as shown in FIG. 3.

The BMS 103 according to the third embodiment of the present disclosure includes a calculator 360 to connect the BMUs 310 to the external device 10, in place of the switch 350 and the switch controller 340.

The calculator 360 may connect the BMUs 310 to the photo coupler 320 freely and selectively. The component of the calculator 360 may be embodied as an electronic circuit module including a logic circuit. An example of the electronic circuit module may include an application-specific integrated circuit (ASIC). However, the present disclosure is not limited thereto.

The BMU 310 having the communication line 330 connected to the photo coupler 320 through the calculator 360 may transmit data to the external device 10.

Figure 5:
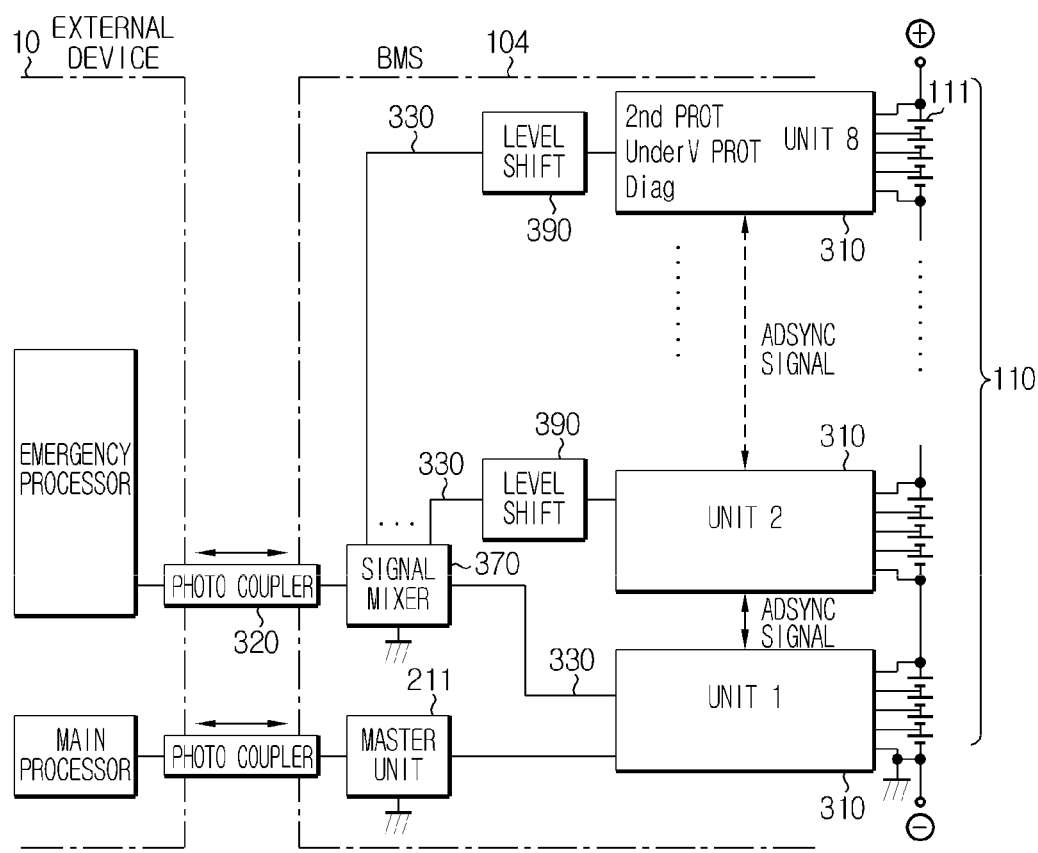

Next, a fourth embodiment according to the present disclosure as shown in FIG. 5 is described. For convenience of understanding, a BMS 104 according to the fourth embodiment of the present disclosure is described with the BMS 103 according to the third embodiment as shown in FIG. 4.

The BMS 104 according to the fourth embodiment of the present disclosure may include a signal mixer 370 to connect the BMUs 310 to the external device 10, in place of the calculator 360.

The signal mixer 370 refers to a device that mixes N data signals into one and outputs a single signal. The signal mixer 370 is a well-known element to those skilled in the art, and its detailed description is omitted herein.

The signal mixer 370 is electrically connected to each of the N communication lines 330. Also, the signal mixer 370 mixes signals received from each BMU 310 into one. Thus, the signals outputted from the N BMUs 310 are mixed into one and transmitted to the external device 10.

Figure 6:
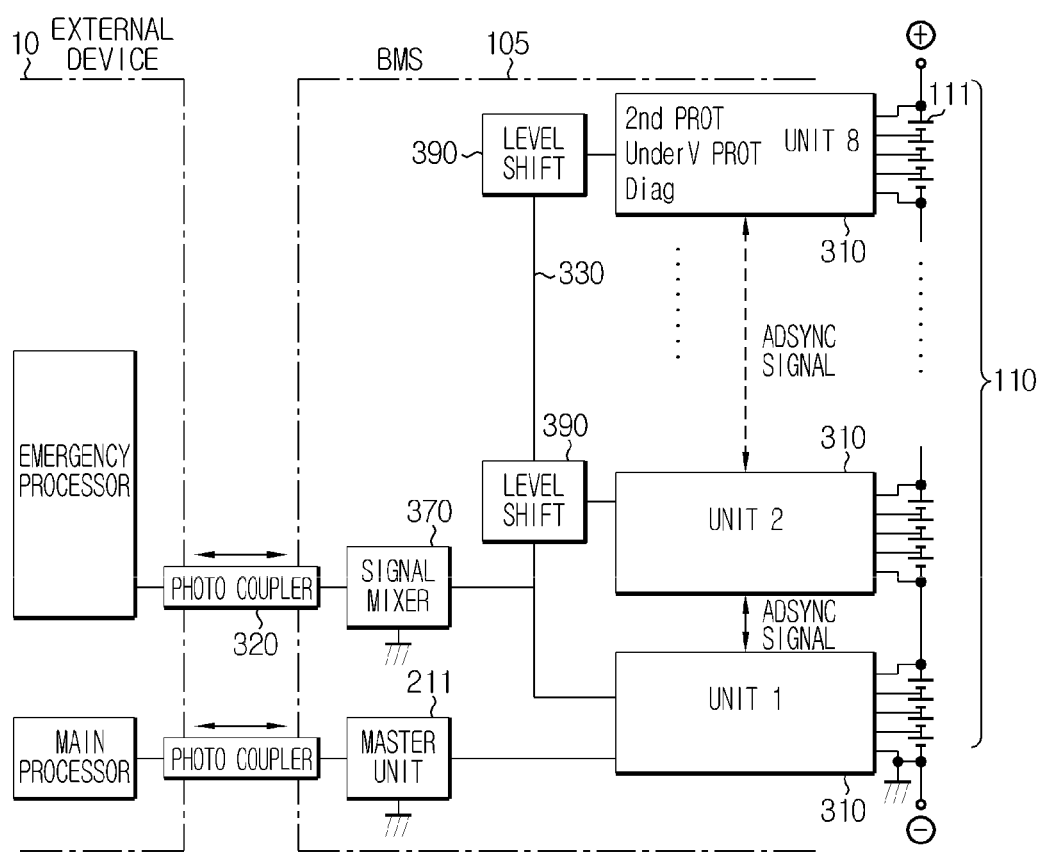

Next, a fifth embodiment according to the present disclosure as shown in FIG. 6 is described. For convenience of understanding, a BMS 105 according to the fifth embodiment of the present disclosure is described with the BMS 104 according to the fourth embodiment as shown in FIG. 5.

In the BMS 105 according to the fifth embodiment of the present disclosure, it can be seen that each BMU 310 is electrically connected to the signal mixer 370 through one communication line 330. Thus, the signal mixer receives the signals outputted from the N BMUs 310 in s sequential order, mixes the signals into one, and transmits a single signal to the external device 10.

In the description of the exemplary embodiments according to the present disclosure, the photo coupler 320 is illustrated as an element connecting the external device 10 to the BMSs 101~105. The photo coupler 320 is an example of an insulation element which electrically separates the external device 10 from the BMSs 101~105 while transmitting a signal. Thus, the scope of the present disclosure is not limited to the photo coupler 320 presented as an example of an insulation element.

In this instance, the BMSs 101~105 according to the present disclosure may further include a level shift 390 electrically connected between each BMU 310 and the communication line 330. The level shift 390 refers to a device that outputs an inputted signal with a potential value of a desired range. The level shift 390 is a known element in the art, and its detailed description is omitted herein.

The BMSs 101~105 according to the present disclosure include the N BMUs 310. The N BMUs 310 manage the secondary batteries 111 included in the battery pack 110. The management of the secondary batteries 111 included in the battery pack 110 by the BMUs 310 represents execution of various types of control applicable at the ordinary level, including charge/discharge current, measurement of electrical characteristic values including voltage or electric current of each secondary battery 111, charge/discharge control, voltage equalization control, state of charge (SOC) estimation, and the like.

In this instance, the battery pack 110 includes at least one secondary battery 111, and the secondary battery 111 is not limited to a specific type. Each secondary battery may include a lithium ion battery, a lithium polymer battery, a Ni—Cd battery, a Ni-MH battery, and a Ni—Zn battery, that is rechargeable and needs to consider a charge or discharge voltage. Also, a number of secondary batteries 111 included in the battery pack 110 may be variously set based on a required output voltage or charge/discharge capacity. However, the present disclosure is not limited by a type, an output voltage and a charge capacity of the secondary battery 111, and the like. Also, although FIGS. 2 through 6 show an embodiment in which all the secondary batteries 111 are connected in series, the present disclosure is not limited to a connection method of the secondary batteries 111.

The BMU 310 according to the present disclosure transmits at least two pieces of data through one communication line 330 dissimilar to the related art. Thus, the at least two pieces of data are outputted as a data signal through time division. To this end, the BMU 310 according to the present disclosure may transmit at least two pieces of data through time division using ADSYNC that changes in logic level of the signal at a data transmission preparation section and a start point of a data transmission section.

The ADSYNC is a sort of communication protocol for data transmission and reception between the BMU 310 and the external device 10. That is, the BMU 310 transmits at least two pieces of data by a prescribed method, and the external device 10 receives and reads the at least two pieces of data by the prescribed method.

Figure 7:
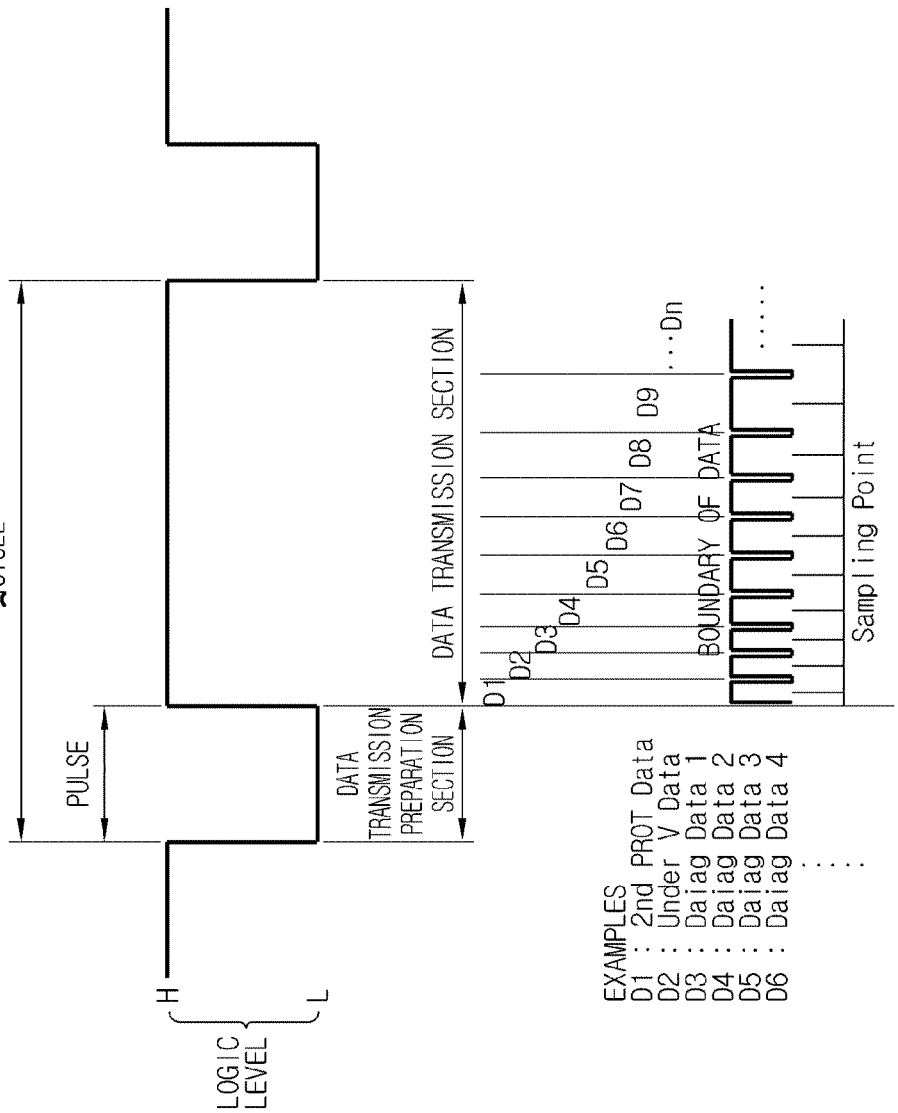
FIG. 7 is a waveform diagram illustrating a configuration of ADSYNC.

FIG. 7 is a waveform diagram illustrating a configuration of ADSYNC.

One cycle of the ADSYNC consists of a data transmission preparation section and a data transmission section. To distinguish the data transmission preparation section from the data transmission section, the ADSYNC changes in logic level of the signal at the data transmission preparation section and a start point of the data transmission section. The data transmission preparation section allows output as a high logic level signal (H), and the data transmission section allows output as a low logic level signal (L). The high logic level may be set to 5V and the low logic level may be set to 0V, but the present disclosure is not limited to the example. In this instance, it will be readily appreciated if the data transmission preparation section illustrated in the drawing is interpreted as a preset minimum width and one cycle is interpreted as a preset minimum width of ADSYNC cycle.

The BMU 310 and the external device 10 synchronized by the ADSYNC may transmit and receive the collected data within the preset width during the data transmission section. From the start point of the data transmission section illustrated in FIG. 7, '2nd_PROT', 'Under V PROT', and 'Diag' may be transmitted in a sequential order. Obviously, the data transmission order may be variously set.

Hereinafter, the ADSYNC cycle represents one cycle of the signal composed of the data transmission preparation section and the data transmission section (ADSYNC cycle=data transmission preparation section+data transmission section).

The at least two pieces of data included in the data transmission section of the ADSYNC may have the same width or different widths from each other.

When the at least two pieces of data included in the data transmission section of the ADSYNC have different widths from each other, a width of data distant from the start point of the data transmission section is wider than a width of data close to the start point of the data transmission section. For example, the width of data distant from the start point of the data transmission section is wider by 5% than the width of data close to the start point of the data transmission section.

When the data receiving side, i.e., the external device 10 side, or the data transmitting side 102 detects or transmits a signal using a resistor-capacitor (RC) oscillator, an error of about 5% or more may occur between transmission and reception. It is obvious that the error reduces with the increasing performance of the RC oscillator, but as the performance becomes higher, the cost of the RC oscillator becomes higher. Thus, when an attempt is made to transmit at least two pieces of data, communication of data is enabled without using a high performance RC oscillator by increasing a width of each data, for example, by 5%, taking a possible error into account. When the error is −5%~+5% and transmission is made with a predetermined width, a number of transmittable and receivable data is limited to nine or less.

As shown in FIG. 7, it can be seen that data is transmitted with the gradually increasing width of each data. Also, a pulse indicating a boundary between the data may be included in the data transmission section of the ADSYNC. In this instance, the increased width of the data may increase in width when an error expected in a system to be actually used is great.

Also, the BMU 310 according to the present disclosure may further include a synchronization line to establish an electrical connection for synchronization with an adjacent other BMU. In this instance, the BMU 310 performs synchronization by the ADSYNC.

When there is a difference in timing at which each BMU measures the voltage or conducts self-diagnosis, voltage measurement is performed incorrectly or data obtained by the voltage measurement may not be helpful to the external device 10. Thus, the BMSs 101~106 are required to perform a synchronization operation of all the BMUs 310 and transmit data.

To this end, a free-run ADSYNC is outputted through the synchronization line interconnected between the BMUs 310. The free-run ADSYNC as used herein refers to a preparative signal for synchronization between the BMUs 310.

Figure 8:
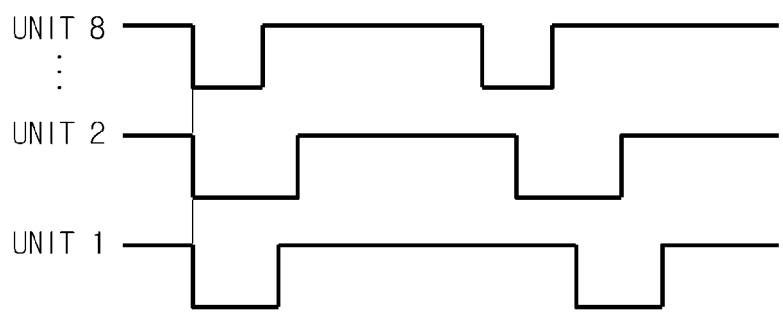
FIG. 8 is a waveform diagram illustrating free-run ADSYNC outputted from a battery management unit (BMU) according to the present disclosure.

FIG. 8 is a waveform diagram illustrating the free-run ADSYNCs outputted from the BMUs 310 according to the present disclosure.

Referring to FIG. 8, it can be seen that the free-run ADSYNCs outputted from the BMUs Unit 1 through Unit 8 differ in width of the data transmission preparation section and width of the ADSYNC cycle. The free-run ADSYNCs of each BMU 310 may serve to identify all the BMUs 310 through the synchronization line.

In this instance, the BMUs 310 according to the present disclosure are synchronized to any one of the outputted free-run ADSYNCs.

According to an exemplary embodiment of the present disclosure, the BMUs 310 are synchronized to a free-run ADSYNC with a narrowest width of the data transmission preparation section and a narrowest width of the ADSYNC cycle among the free-run ADSYNCs outputted form the plurality of BMUs 310.

Figure 9:
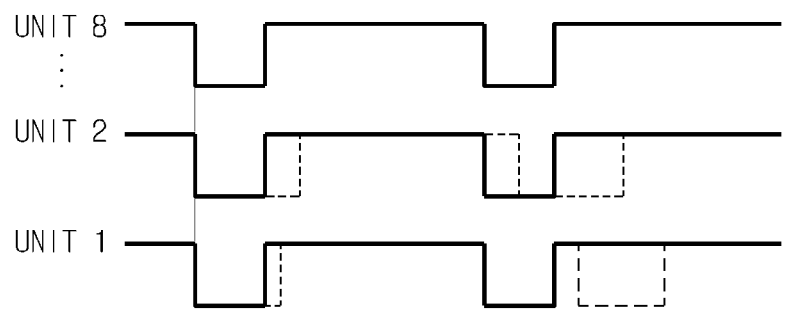
FIG. 9 is a waveform diagram illustrating synchronized free-run ADSYNC according to an exemplary embodiment of the present disclosure.

FIG. 9 is a waveform diagram illustrating the synchronized free-run ADSYNCs according to an exemplary embodiment of the present disclosure.

Referring to FIGS. 8 and 9 together, it can be seen in FIG. 8 that the width of the data transmission preparation section of Unit 8 is narrowest and one cycle of free-run ADSYNC is earliest. Thus, according to an exemplary embodiment of the present disclosure, it can be seen in FIG. 9 that the free-run ADSYNCs of Unit 1 and Unit 2 are synchronized with the free-run ADSYNC of Unit 8.

Subsequently, each BMU 310 measures the voltage of the secondary batteries 111 or conducts a failure diagnosis according to the synchronized ADSYNC cycle. Also, when each BMU 310 transmits data to the external device 10, the BMUs 310 may determine a transmission order of their data.

According to the present disclosure, the BMS and the external device may be connected using a small number of insulation elements.

Meanwhile, in the description of the present disclosure, it should be understood that each element or component of the present disclosure shown in FIGS. 2 through 6 is distinguished logically rather than physically.

That is, each element or component corresponds to a logic element or component to realize the technical spirit of the present disclosure, and accordingly, it should be understood that even though each element or component is integrated or separated, it falls within the scope of the present disclosure if a function performed by a logic element or component of the present disclosure can be implemented, and it falls within the scope of the present disclosure regardless of whether names are identical or not if it is an element or component performing an identical or similar function.

While the present disclosure has been hereinabove described in connection with a limited number of embodiments and drawings, the present disclosure is not limited thereto, and it should be understood that various modifications and changes may be made by those skilled in the art within the technical spirit of the invention and equivalents to the appended claims.

What is claimed is:

1. A battery management system for managing a battery pack, comprising:
    N battery management units configured to manage secondary batteries included in the battery pack, in which N is a natural number greater than or equal to 2;
    N communication lines, each communication line electrically connected to one of the battery management units to transmit data to an external device which controls the battery management system; and
    N insulation elements connected between the external control device and the battery management system and configured to transmit a signal while electrically separating the external device from the N communication line;
    wherein each battery management unit transmits at least two pieces of data through time division.

2. The battery management system according to claim 1, wherein the insulation element is a photo coupler.

3. The battery management system according to claim 1, further comprising:
    a level shift electrically connected between each battery management unit and the communication line.

4. The battery management system according to claim 1, wherein each battery management unit transmits at least two pieces of data through time division using ADSYNC changing in logic level of a signal at a data transmission preparation section and a start point of a data transmission section.

5. The battery management system according to claim 4, wherein the at least two pieces of data included in the data transmission section of the ADSYNC have the same width of each data.

6. The battery management system according to claim 4, wherein among the at least two pieces of data included in the data transmission section of the ADSYNC, a width of data distant from the start point of the data transmission section is wider than a width of data close to the start point.

7. The battery management system according to claim 6, wherein the width of the data distant from the start point of the data transmission section is wider by at least 5% than the width of the data close to the start point of the data transmission section.

8. The battery management system according to claim 4, wherein a pulse indicating a boundary between the data is included in the data transmission section of the ADSYNC.

9. The battery management system according to claim 1, wherein the N battery management units further comprise a synchronization line to establish an electrical connection for synchronization with adjacent other battery management unit.

10. The battery management system according to claim 1, wherein each battery management unit transmits different types of data through the communication line, the different types of data being transmitted sequentially in time.

11. A battery management system for managing a battery pack, comprising:

N battery management units configured to manage secondary batteries included in the battery pack, in which N is a natural number greater than or equal to 2;

N communication lines, each communication line electrically connected to one of the battery management units to transmit data to an external device which controls the battery management system;

an insulation element configured to transmit a signal while electrically separating the external control device from the battery management system;

a switch configured to selectively connect any one of the N communication lines to the insulation element by a control signal; and a switch controller configured to output a control signal to the switch;

wherein each battery management unit transmits at least two pieces of data through time division.

12. The battery management system according to claim 11, wherein the switch controller is connected to the external device through the insulation element, and is controlled by the external device.

13. The battery management system according to claim 12, wherein the N battery management units perform synchronization by ADSYNC.

14. The battery management system according to claim 13, wherein the N battery management units respectively output a free-run ADSYNC and are synchronized to any one of the outputted free-run ADSYNCs.

15. The battery management system according to claim 14, wherein the N battery management units are synchronized to a free-run ADSYNC with a narrowest width of a data transmission preparation section and a narrowest width of an ADSYNC cycle among the free-run ADSYNCs outputted from the N battery management units.

16. The battery management system according to claim 11, wherein each battery management unit transmits different types of data through the communication line, the different types of data being transmitted sequentially in time.

17. A battery management system for managing a battery pack, comprising:

N battery management units configured to manage secondary batteries included in the battery pack, in which N is a natural number greater than or equal to 2;

N communication lines, each communication line electrically connected to one of the battery management units to transmit data to an external device which controls the battery management system;

an insulation element configured to transmit a signal while electrically separating the external control device from the battery management system; and a calculator electrically connected to the N communication lines to connect any one of the N communication lines to the insulation element;

wherein each battery management unit transmits at least two pieces of data through time division.

18. The battery management system according to claim 17, wherein the calculator is connected to the external device through the insulation element, and receives a control signal from the external device.

19. The battery management system according to claim 17, wherein each battery management unit transmits different types of data through the communication line, the different types of data being transmitted sequentially in time.

20. A battery management system for managing a battery pack, comprising:

N battery management units configured to manage secondary batteries included in the battery pack, in which N is a natural number greater than or equal to 2;

N communication lines, each communication line electrically connected to one of the battery management units to transmit data to an external device which controls the battery management system;

an insulation element configured to transmit a signal while electrically separating the external control device from the battery management system; and a signal mixer electrically connected to the N communication lines to mix signals received through the N communication line;

wherein each battery management unit transmits at least two pieces of data through time division.

21. The battery management system according to claim 20, wherein each battery management unit transmits different types of data through the communication line, the different types of data being transmitted sequentially in time.

22. A battery management system for managing a battery pack, comprising:

N battery management units configured to manage secondary batteries included in the battery pack, in which N is a natural number greater than or equal to 2;

a communication line, each communication line electrically connected to one of the battery management units to transmit data to an external device which controls the battery management system;

an insulation element configured to transmit a signal while electrically separating the external control device from the battery management system; and a signal mixer electrically connected to the communication line to mix signals received from each battery management unit through the communication line;

wherein each battery management unit transmits at least two pieces of data through time division.

23. The battery management system according to claim 22, wherein each battery management unit transmits different types of data through the communication line, the different types of data being transmitted sequentially in time.

* * * * *